(12) United States Patent
Bays et al.

(10) Patent No.: US 6,377,086 B1
(45) Date of Patent: Apr. 23, 2002

(54) LOW POWER DUAL-VOLTAGE SENSE CIRCUIT BUFFER

(75) Inventors: Laurence E. Bays; Dennis A. Brooks, both of Allentown; Xingdong Dai, Bethlehem; Richard Muscavage, Gilbertsville, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/412,491

(22) Filed: Oct. 5, 1999

(51) Int. Cl.[7] ............................................... H03B 1/00
(52) U.S. Cl. .................... 327/109; 327/544; 326/27; 326/83; 307/412
(58) Field of Search .................. 327/108–112, 530, 327/538, 544, 547; 326/26, 27, 82–84, 86; 307/412; 365/189.05

(56) References Cited

U.S. PATENT DOCUMENTS 4,829,203 A * 5/1989 Ashmore, Jr. ............ 365/185.1
5,783,947 A   7/1998 Kawano ..................... 324/765

* cited by examiner

Primary Examiner—Timothy P. Callahan
Assistant Examiner—Minh Nguyen
(74) Attorney, Agent, or Firm—Synnestvedt & Lechner LLP

(57) ABSTRACT

A fully-static dual-voltage sense circuit designed for a mixed-voltage system senses the power-rail voltage of other devices that the device is interfaced with, and achieves a low-power consumption level without software assistance when the sensing circuit is active, and protects low-voltage process devices in the circuit from possible high voltage damage at the interface. In a preferred embodiment, the present invention includes an integrated circuit having a dual-voltage sense circuit, the sense circuit including a sense circuit input node supplied with an input voltage Vin; a sense circuit power input node supplied with a power-supply voltage; and a sense circuit output node outputting a digital signal of a voltage level equal to or less than the voltage level of a low-voltage digital signal, regardless of the voltage level of the input voltage.

10 Claims, 9 Drawing Sheets

LOW POWER DUAL-VOLTAGE SENSE CIRCUIT BUFFER

FIELD OF THE INVENTION

The present invention relates to an integrated circuit (IC) having a static dual-voltage sensing circuit for use in a mixed-voltage system (a system containing both high and low voltage components).

BACKGROUND OF THE INVENTION

Differential signal amplifier circuits are commonly used in electronic circuits to compare an input voltage level, e.g., from an interfaced power source (a source of power derived from another part of the electronic circuit) with a reference voltage and output a difference signal representing the difference between the two voltages. FIG. 1 illustrates a differential signal amplifier circuit of the prior art. An input voltage Vin input to a pad P1 is first scaled down to a suitable level by passing it through a linear network, such as a resistor network comprising resistors RA2 and RA3. Then the scaled-down input voltage is compared to a reference voltage generated by the device power supply VDD, also using a linear network such as a resistor network comprising resistors RA5 and RA7. In doing so, however, the circuit contains three major power consumption sources.

There are two direct current paths from the device power supply (VDD) to ground, one for the reference voltage generation through resistor network RA5 and RA7, and the other for one of the two branches on the differential signal amplifier (either through transistors MP27 and MN26 or through transistors MP25 and MN22). There also exists a direct current path for the voltage Vin from the interfaced power supply to ground for the scaled-down input voltage generation, via resistor network RA2 and RA3. These direct paths drain not only the device power supply, but also the power supply of the interfaced device. Thus, it is a challenge to meet the power budget for the device connected to the voltage sensing circuit (e.g., a modem) and for the system as a whole.

In an attempt to reduce the steady-state dc current drain of differential signal amplifier circuits, some differential signal amplifier circuits employ a power-down mode implemented through software. After sampling the voltage and latching the result into a register, the device turns off the reference voltage path to conserve power. This is accomplished with software assistance, for example, by a software program that sets a power-down mode bit in a control register to control operation of the device between the normal mode and the power-down mode. A circuit of this kind has at least two major drawbacks. First, the software required to control the circuit can be very complex. The software must be able to switch off the power-down mode when the higher voltage interfaced circuit is operating, and must switch on the power-down mode after it latches the correct voltage logic value in a register, and then be able to repeat the on-and-off processes each time the interfaced device changes state. Therefore, the software must constantly monitor the current status (i.e., on or off) of the interfaced device. Second, since switching to the power-down mode does not remove the source of the power consumption, i.e. the direct path from the power supply to ground, when the differential signal amplifier sensing circuit is active, there will still be significant power drain occurring.

In certain applications it is desirable to utilize low voltage circuits to reduce the power consumed by the circuit. This has become increasingly important with the proliferation of battery-operated computers, PIM's, telephones, and like devices. However, use of a low-voltage circuit interfaced with a high-voltage power supply can cause damage to the low-voltage components of the low-voltage circuits. Accordingly, buffer circuits have been developed which operate at low voltage but which can tolerate operation without damage in high voltage environments.

No one has developed a dual-voltage sensing circuit that would be considered "low power," i.e., one that draws reduced power during operation. For some low power applications, such as mobile computing device, cellular devices, and hand-held PDA devices, the periods of active differential signal amplifier sensing and the power drain associated with the sensing is too great to tolerate, causing significant drain on the battery that powers the mobile devices.

SUMMARY OF THE INVENTION

A fully-static dual-voltage sense circuit is designed for a mixed-voltage system. This circuit senses the power-rail voltage of other devices that the device is interfaced with, and can achieve a low-power consumption level without software assistance when the sensing circuit is active, and protects low-voltage process devices in the circuit from possible high voltage damage at the interface. In a preferred embodiment, the present invention comprises an integrated circuit having a dual-voltage sense circuit. The sense circuit includes a sense circuit input node supplied with an input voltage Vin; a sense circuit power input node supplied with a power-supply voltage; and a sense circuit output node outputting a digital signal of a voltage level equal to or less than the voltage level of a low-voltage digital signal, regardless of the voltage level of the input voltage.

DETAILED DESCRIPTION OF THE PREFERRED EMBODIMENT

Figure 1:
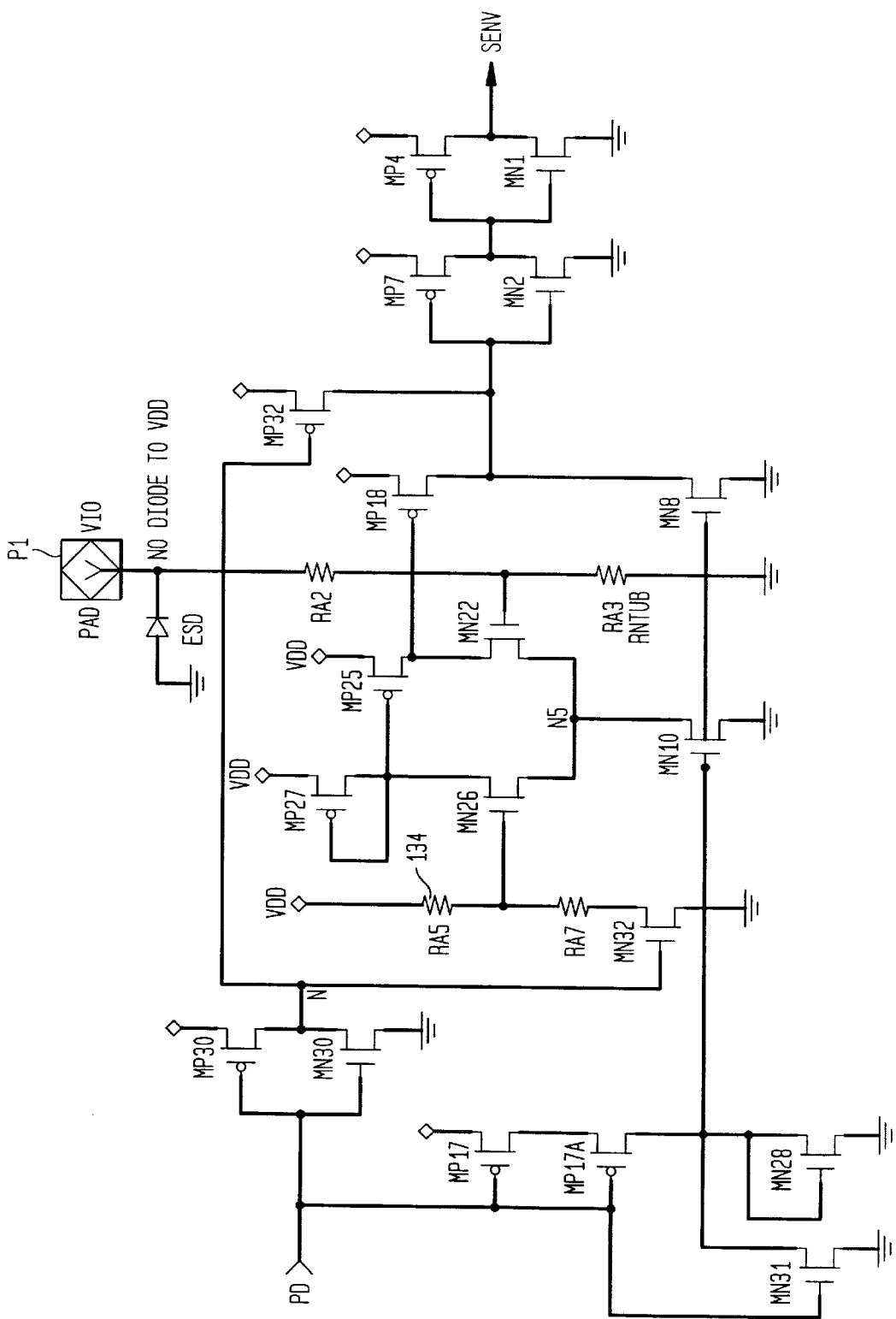
FIG. 1 illustrates a differential signal amplifier circuit of the prior art.

For the purpose of this explanation, there are several voltages that need to be defined. As used herein, the following terms have the following definitions: Vhigh means a digital 1, nominally 5 volts; Vlow means a digital 1, nominally 3.3 volts; Vzero means a digital 0; Vin is a voltage from a power source typically external to the circuit itself, i.e., an interfaced power source. Vin typically ranges between 0 and about 6 volts; VDD is the IC device power supply (for low voltage process devices, VDD equals Vlow i.e., nominally 3.3 volts; and for high voltage process devices, VDD equals Vhigh, i.e., nominally 5 volts); Vth equals the NMOS transistor threshold voltage typically 0.7 volts; and Vtr equals the trip-point voltage of a CMOS inverter.

Both 5V and 3.3V are semiconductor industry conventional power supply levels. However, it should be understood that the circuit principles described herein are not limited to power-supply voltages of 5V and/or 3.3V.

Figure 2:
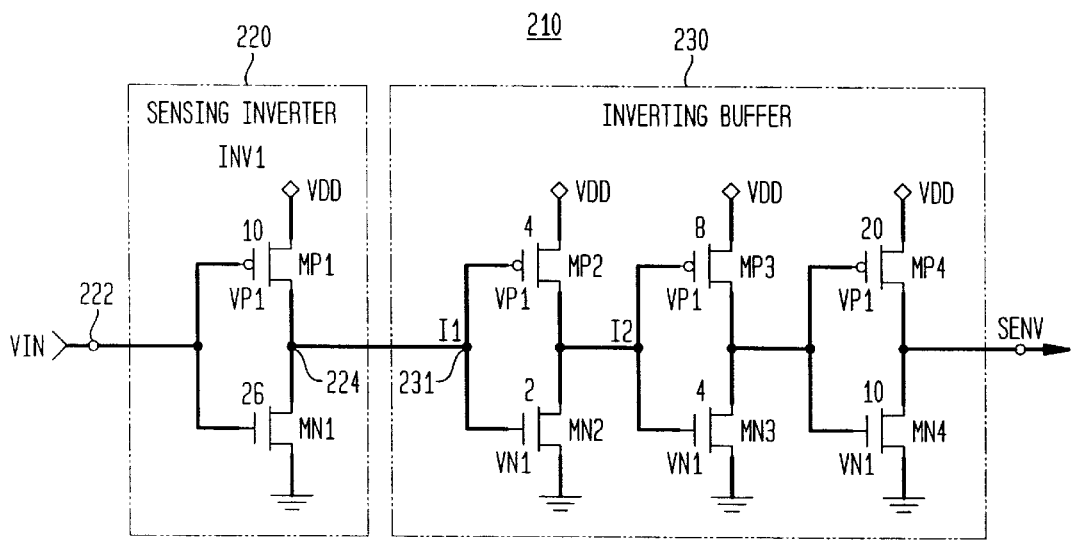
FIG. 2 illustrates a prior art high-voltage (5V) process sensing circuit.

FIG. 2 illustrates a prior art high-voltage (5V) process sensing circuit. Since it is a high-voltage circuit it is built to withstand the rigors of 5 volt operation. A sensing circuit 210 comprises a sensing inverter 220 and an inverting buffer 230. For a 5V process device, the design of sensing circuit 210 is simple and straightforward. Sensing inverter 220 has a power input node 222 and an output node 224 and can comprise a PMOS transistor MP1 and an NMOS transistor MN1, each sized so that the trip point Vtr is set at (Vhigh+Vlow)/2 or ≡4V. Power input node 222 is connected to the gates of transistors MP1 and MN1, thereby connecting them to Vin, and the sensing inverter 220 is powered by the device power supply VDD (5V). Therefore, the circuit of FIG. 2 is a fully-static CMOS circuit. When Vin is 5V, transistor MP1 is fully off and transistor MN1 is fully on, thus pulling the output node 224 of the sensing inverter 220 to 0V (a digital 0) in a known manner. The circuit draws zero steady-state dc current in this state.

When Vin drops to 3.3V, both transistors MP1 and MN1 are weakly on (neither at the 5 volt power rail or the 0 volt ground rail). But since transistors MP1 and MN1 are disproportionately sized so that they have a trip point at 4V, transistor MP1 will dominate and pull the output of the sensing inverter 220 to 5V (a digital 1). Transistor MN1 can be chosen so that the steady-state dc current of the sensing inverter 220 is near-zero. For example, if MP1 is selected to be a very strong transistor, and MN1 is selected to be very weak, if the gate voltage Vin is 3.3 volts, MP1 will be completely on and MN1 will be completely off. The selection of a strong PMOS transistor and a weak NMOS transistor is consistent with setting a higher trip point voltage for the sensing inverter 220. If MN1 is weak enough, it acts essentially as a large resistor, which minimizes leakage current.

Since the device is high voltage (5V) process device, high voltage breakdown is not an issue since the circuit is designed to handle 5 volts. The digital output can be immediately used by subsequent circuits.

Inverting buffer 230, while not essential to the operation of the circuit, boosts the drive speed and strength of sensing inverter 220. The inverting buffer 230 has an input node 231 connected to output node 224 of sensing inverter 220, and an output node SENV. Inverting buffer 230 outputs a digital 1 at output node SENV when an input of 5 volts is present at power input node 222 and a digital 0 when an input of 3.3 volts is present at power input node 222 (i.e., a digital 0 indicates the voltage is less than Vtr, so it is known to be 3.3V or less).

The prior art circuit of FIG. 2 operates adequately as long as it is operating in a high voltage environment, but cannot be used in a mixed high and low voltage environment. First, regardless of the level of the voltage Vin (3.3V or 5V) present at power input node 222, it will still output a logic 1 of output node 224 of sensing inverter 220 if the sensing inverter 220 is a low-voltage (3.3V) powered inverter, since VDD is 3.3 volts. Therefore, the digital output of output node SENV will always be 0 regardless of which power supply level (5V or 3.3V) is presented to power input node 222. Second, since the circuit is designed with components that have to withstand only 3.3V operation, if the circuit is used in a high voltage environment and the voltage Vin present at power input node 222 is 5V, it presents a 5V voltage stress across the gate-source of the NMOS transistor MN1 of the sensing inverter 220. This could lead to NMOS gate oxide breakdown and device failures for low voltage devices in the system.

Figure 3:
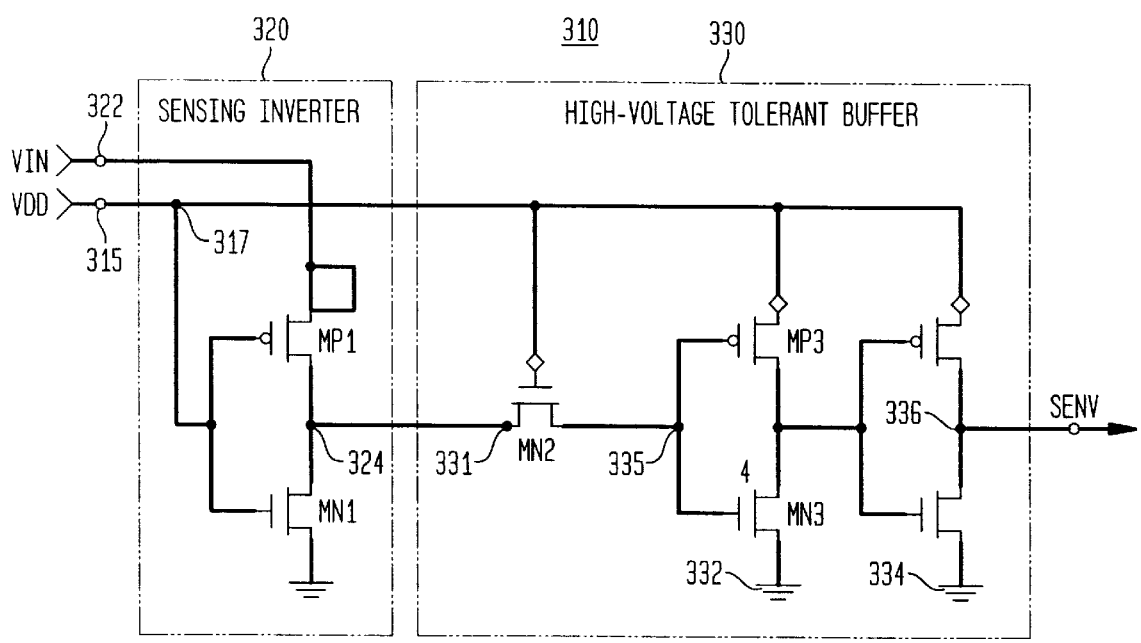
FIG. 3 illustrates a dual-voltage sense circuit in accordance with the present invention.

FIG. 3 illustrates a dual-voltage-range sense circuit according to the present invention. For the device of FIG. 3, the simple inverter design illustrated in FIG. 2 for a 5V device cannot be used. In the sensing inverter 320 of FIG. 3, the connections of input voltage Vin and the device power supply VDD are reversed. Thus, when the input voltage Vin applied to sense circuit input node 322 is 5V, the digital output at output node 324 of sensing inverter 320 is Vhigh, a logic 1 at 5V. This 5V output cannot be immediately used by low voltage circuits which are powered by 3.3V VDD, because it would cause subsequent circuit gate oxide breakdown in the components of the low voltage circuits. When Vin is 3.3V, the digital output at output node 324 is Vzero. The sensing inverter 320 includes transistors MN1 and MP1 sized to have a trip point of (Vhigh+Vlow)/2 or 4V, thereby enabling the above-described ability to discern between a 5V and 3.3V input applied to input node 322.

To make the sense circuit 310 tolerant to high voltages, a high voltage tolerant buffer 330 includes transistor MN2 and inverters 332 and 334. A 5V logic 1 Vhigh received at the input node 331 of buffer 330 is scaled down to a 3.3V logic 1 using transistor MN2 in a known manner. Transistors MN3 and MP3 comprise inverter 332. Transistors MN3 and MP3 are sized so that the trip point of inverter 332 is approximately VDD/2 or 1.5V, which is the normal case for a CMOS inverter. Inverter 334 also has a trip point of 1.5V, but differs from inverter 332 in that it has a larger driver strength, since the two inverters combine to form a buffer. The input node 331 of buffer 330 (and therefore the source of transistor MN2) is connected to the output node 324 of sensing inverter 320. The gate of transistor MN2 is connected to 3.3V VDD, so the gate-source voltage of transistor MN2 is always less than 3.3V. The drain of transistor MN2 is connected to input node 335 of inverter 332. When the output of sensing inverter 320 is Vzero (when Vin=3.3V), a logic 0 at 0V (Vzero) is passed by transistor MN2 to the input of inverter 332. When the output of sensing inverter 320 is Vhigh (logic 1 at 5V, when Vin=5V), the drain of transistor MN2 will sit at VDD-Vth (one threshold-voltage down from 3.3V). With the threshold voltage Vth of an NMOS transistor being typically less than 1V for most processes, VDD-Vth still operates as a logic 1 with respect to inverter 332, but it is a Vlow logic 1 (3.3V). The function of transistor MN2 is to scale down the high voltage for the rest of the circuit, while passing the low voltage without loss. Inverters 332 and 334 (with trip points Vtr≡1.5V) together buffer the sensing signal so that the output SENV of the circuit equals Vlow (logic 1 at 3.3V) when Vin=5V and SENV=Vzero (logic 0 at 0V) when Vin=3.3V.

The circuit of FIG. 3 is a fully-static CMOS circuit. When Vin at input node 322 is 3.3V, transistor MP1 is completely off and transistor MN1 is on, thereby pulling the output node 324 of sensing inverter 320 to logic 0 at 0V. This logic 0 is further passed on without loss to inverters 332 and 334, therefore achieving a zero steady-state dc current drain for the circuit 332 and 334. When Vin at input node 322 is 5V, transistor MP1 dominates transistor MN1 and pulls the output node 324 of sensing inverter 320 to logic 1 at 5V. This logic 1 is scaled down to VDD-Vth by transistor MN2 before being applied to the gates of inverter 332 at input node 335. The output of inverter 332 is 3.3V VDD and the output of inverter 334 is, therefore, a logic 0 at 0V. In this situation, both sensing inverter 320 and inverter 332 may have certain amounts of leakage current because their gate voltages are not at power (VDD) or ground (VSS) rail levels. However, the sources of the leakage currents are different. The leakage current of sensing inverter 320 is from Vin (the input node), and the leakage current of inverter 332 is from VDD, (the device power supply). By sizing the inverters 320 and 332 by using a strong PMOS transistor and a weak NMOS transistor for inverter 320 and weak NMOS and PMOS transistors for inverter 332, these leakage currents become insignificant and therefore the circuit operates with near-zero steady-state dc current. The leakage currents become insignificant because the weaker NMOS transistors minimize the leakage current.

Using a weak NMOS transistor and a strong PMOS transistor for inverter 320 is consistent with the setting of a high trip point voltage for inverter 320, and using weak transistors for both the NMOS and PMOS transistors of inverter 332 is consistent with setting the trip point of inverter 332 at 1.5V. The sensing inverter 320 of FIG. 3 illustrates one exemplary configuration. Common CMOS inverters have PMOS and NMOS transistors ratioed between 2:1 and 4:1 to create a trip point around half the voltage level of the power supply. To make a higher-threshold inverter, such as sensing inverter 320, the sizes of the PMOS and NMOS transistors need to be further polarized (i.e., ratioed greater than 4:1). The end result is a very wide short-channel PMOS transistor and a very narrow long-channel NMOS transistor. This is not optimal, since the layout of such an inverter may not be area efficient, i.e., it will take up a lot of space.

Figure 4:
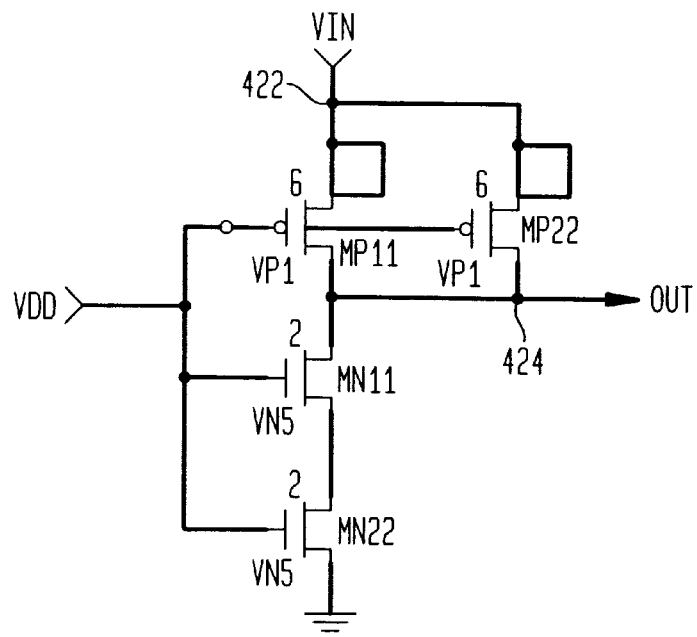
FIG. 4 illustrates an alternative embodiment of the high-threshold sensing inverter of FIG. 3.
Figure 5:
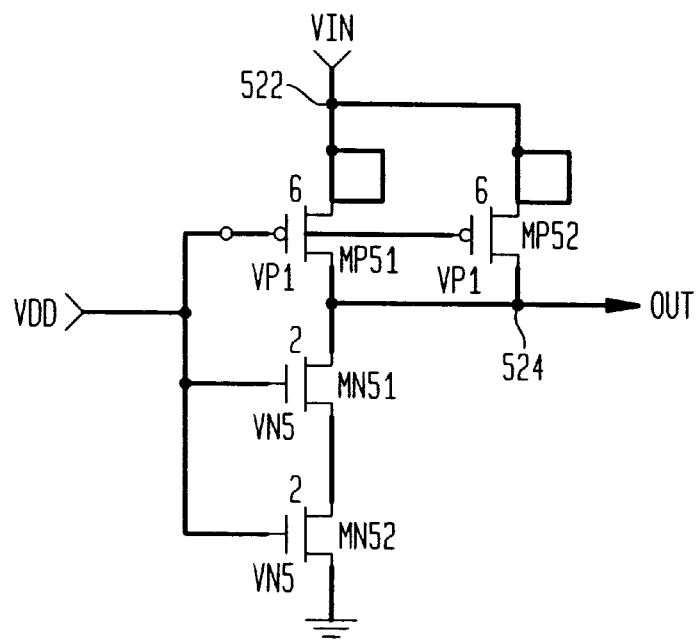
FIG. 5 illustrates another alternative embodiment of the high-threshold sensing inverter of FIG. 3.

FIGS. 4 and 5 illustrate two alternative embodiments of the high-threshold sensing inverter 320 of FIG. 3 which function optimally in the present invention. The single wide short-channel PMOS transistor MP1 of FIG. 3 is replaced in FIG. 4 by two or more regularly-sized PMOS transistors in parallel. Referring to FIG. 4, MP1 of sensing inverter 320 is replaced with two identical PMOS transistors MP11 and MP22, both sourced from Vin at input node 422. Using two PMOS transistors in parallel, the channel-width is effectively doubled, so that the sizing of the transistors MP11 and MP22 can be half as wide as transistor MP1 of circuit 320 of FIG. 3. Similarly, transistor MN1 of circuit 320 is replaced with two identical NMOS transistors, MN11 and MN22, in series. Once again, the channel width of series transistors MN11 and MN22 can be half as long as the channel width of transistor MN1 of FIG. 3.

For a high-speed digital circuit, a single very-long-channel NMOS transistor usually cannot be replaced by two or more regularly-sized NMOS transistors in series as shown in FIG. 4. In a high speed digital circuit, two serially-connected short-channel NMOS transistors will behave like single short-channel NMOS transistors. However, when the signal is a DC signal as in the case of the sense circuit of the present invention, connecting the transistors in series allows regular-sized transistors to be used.

In FIG. 5, the PMOS configuration (MP51 and MP52) is identical to that of FIG. 4. However on the NMOS side, MN1 of sensing inverter 320 of FIG. 3 is replaced with a regular NMOS transistor MN51 and a NMOS diode-configured gate-to-drain transistor MN52. The diode-configured transistor MN52 acts as a resistor, therefore resulting in a weak pull-down effect. Second, the diode-configured transistor MN52 boosts the voltage at the source of transistor MN51 to 0.7 volts, instead of common ground (0 volts). This causes the gate-source voltage applied to transistor MN51 to be smaller than the gate-source voltage of transistor MN1 of circuit 320. Therefore, for the same pull-down strength, a shorter channel device can be used, thus allowing more efficient layout on the integrated circuit.

A downside to using the diode in the pulldown path is that the gate of inverter 332 of FIG. 3 can only be pulled down to Vth. Therefore this could lead to a small amount of leakage current in inverter 332 because the gate is not at the ground rail level.

NMOS transistor MN2 of FIG. 3 scales down the output from output node 324 of the sensing inverter 320 to (VDD-Vth) and applies it to the input node 335 of inverter 332, where VDD is the device power supply (3.3V), and Vth being the transistor threshold voltage. Therefore, no voltage higher than the device power supply VDD can be delivered to the input node 335 of inverter 332 and thus there will be no possibility that circuits beyond inverter 332 can suffer from high voltage breakdown. However, over long periods of time, 5V at the source of transistor MN2 could pull the drain of transistor MN2 (and thus input node 335 of inverter 332) to 5V because of the leakage of transistor MN2. This poses a gate oxide breakdown threat for transistor MN3 of inverter 332.

Figure 6:
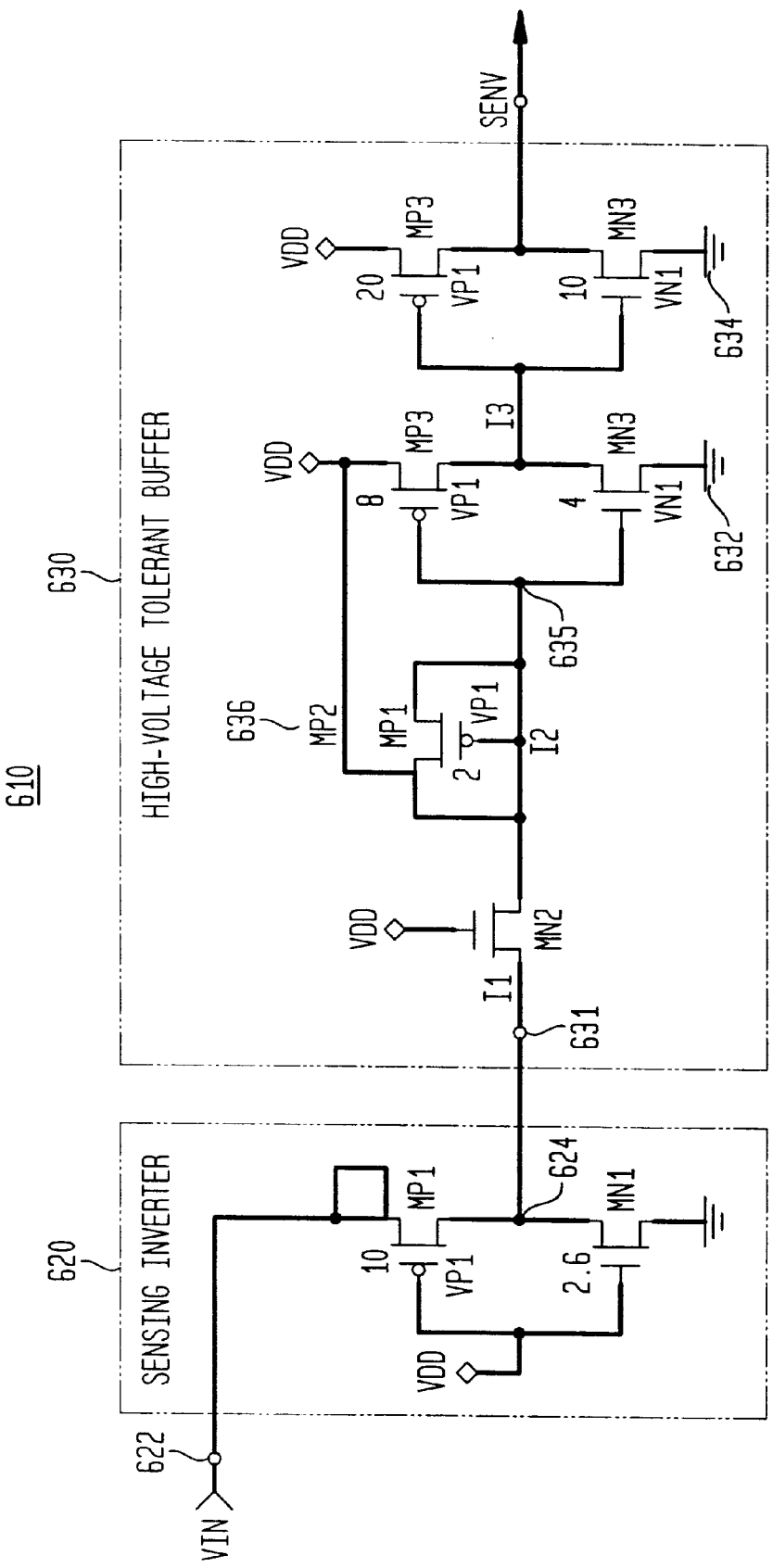
FIG. 6 illustrates an alternative embodiment of the present invention illustrating a high voltage tolerant buffer which prevents leakage-induced high voltage breakdown.
Figure 7:
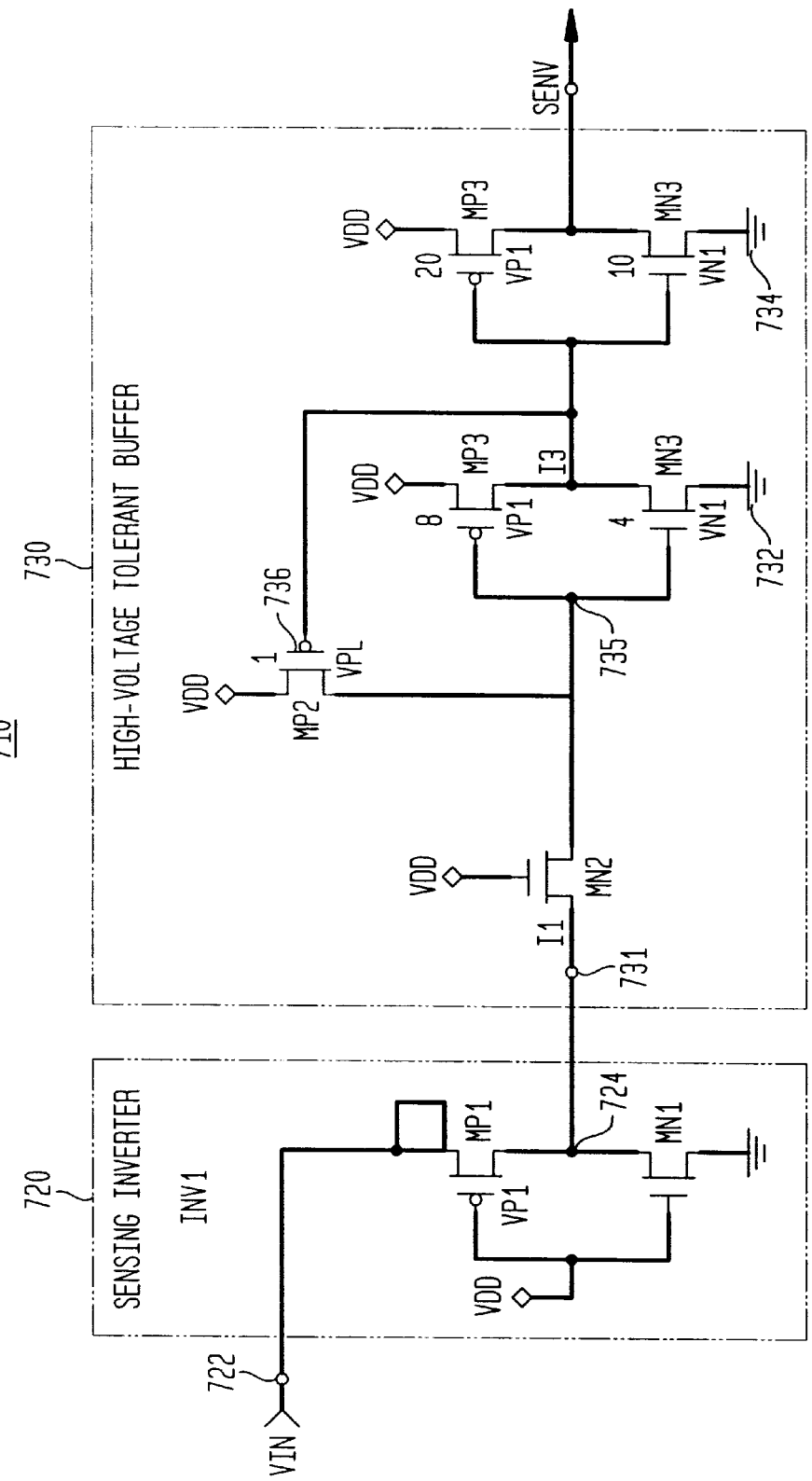
FIG. 7 illustrates another alternative embodiment of the present invention illustrating a high voltage tolerant buffer which prevents leakage-induced high voltage breakdown.

FIGS. 6 and 7 illustrate two ways to prevent the above-described leakage-induced high voltage breakdown on inverter 332. Referring to FIG. 6, a diode-connected transistor 636 has its P-end connected to the input node 635 of inverter 632 and its N-end connected to the device power supply VDD which is 3.3V for a low-voltage circuit. When the input node 635 of inverter 632 is pulled higher than VDD+Vth, diode-connected transistor 636 is turned on to lock the gate voltage of inverter 632 at VDD+Vth. Diode 636 can be constructed using a PMOS transistor having its gate, source, and drain tied together to the input node 635 inverter 632 and its substrate connected to 3.3V VDD, as shown. The PMOS source and drain form the P-end of the diode 636. The PMOS substrate forms the N-end.

FIG. 7 illustrates an alternative structure for preventing the leakage-induced high voltage breakdown. This is accomplished using a weak feedback pull-up PMOS transistor 736 with its gate connected to the output of inverter 732, its source to 3.3V VDD, and its drain to the input node 735 of inverter 732. When the voltage at input node 735 of inverter 732 is of a level sufficient to make its output low it turns on the feedback pull-up PMOS transistor 736 and clamps the input node 735 of inverter 732 at 3.3V VDD. In addition the feedback pull-up PMOS transistor 736 restores the input node 735 of inverter 732 to VDD and stops the leakage current of inverter 732, as opposed to the circuit of FIG. 6, which presents VDD-Vth at input node 735. Further, the feedback pull-up PMOS transistor 736 also provides a small amount of hysteresis to guard against some unwanted events, such as input voltage glitches approaching ground level.

Figure 8:
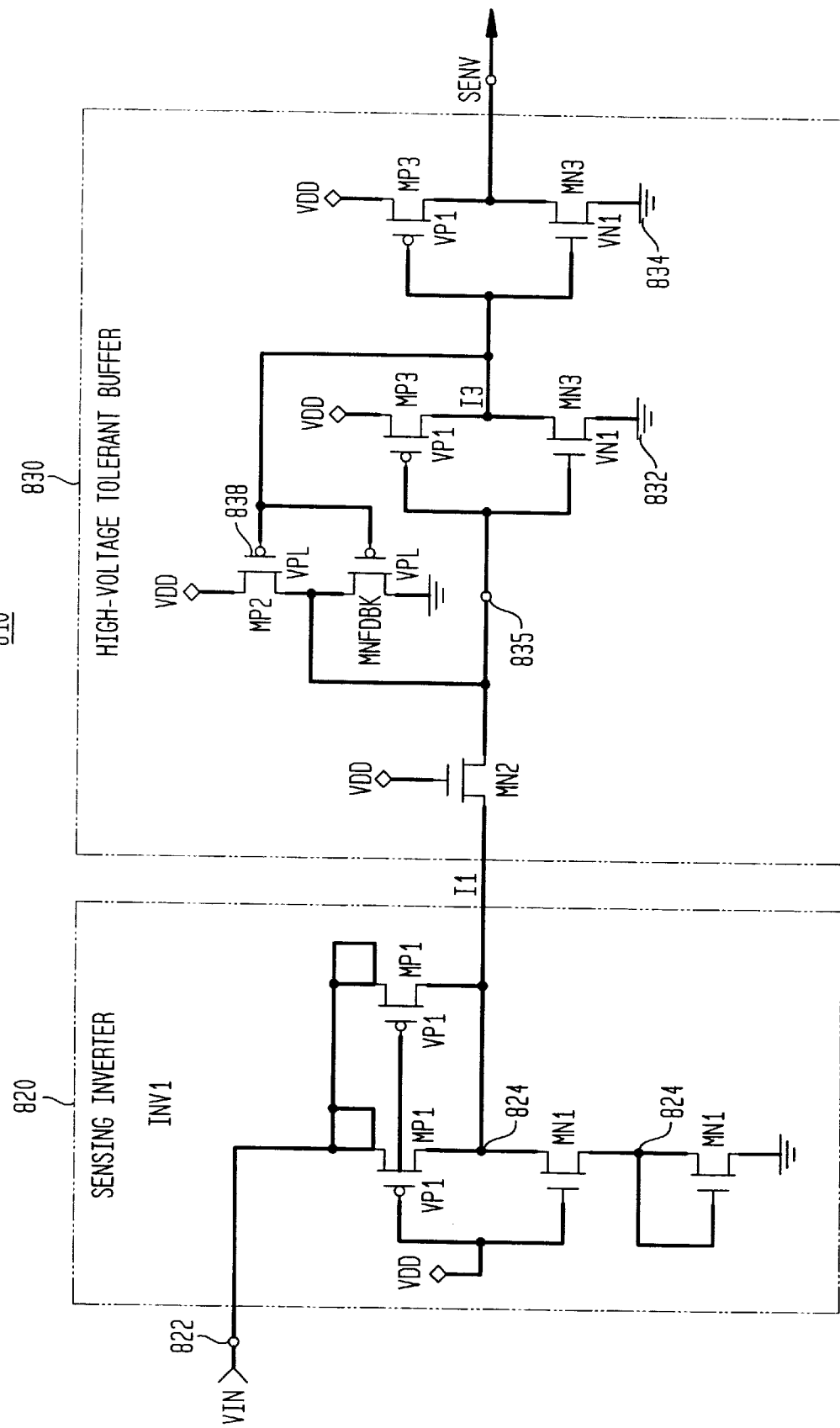
FIG. 8 illustrates a third embodiment of the present invention illustrating a high voltage tolerant buffer which prevents leakage-induced high voltage breakdown.

Another alternative, shown in FIG. 8, utilizes a weak feedback inverter 838 with inverter 832. The function of the PMOS transistor MP2 of the weak feedback inverter 838 is the same as described above. An NMOS transistor MNFDBK of the weak feedback inverter 838, however, restores the input node 835 of inverter 832 to the full ground rail level and stops the leakage current through inverter 832, when the front end sensing inverter is using the high-threshold inverter of FIG. 5.

The circuit of FIG. 3 works well when the device is already in a steady state with VDD and Vin applied and stable. However, in many applications, the device must go through many power-up and power-down cycles, where VDD and Vin can be applied in any sequence and at many levels before going into or after going out of the steady state. For example, if Vin is at 5V and the device is powered down with VDD grounded, the PMOS transistor MP1 of sensing inverter 320 will be stressed with a gate-source voltage of 5V. This could lead to device breakdown. To avoid stressing the device in non-steady state situations, a fail-safe mechanism may be used.

Figure 9:
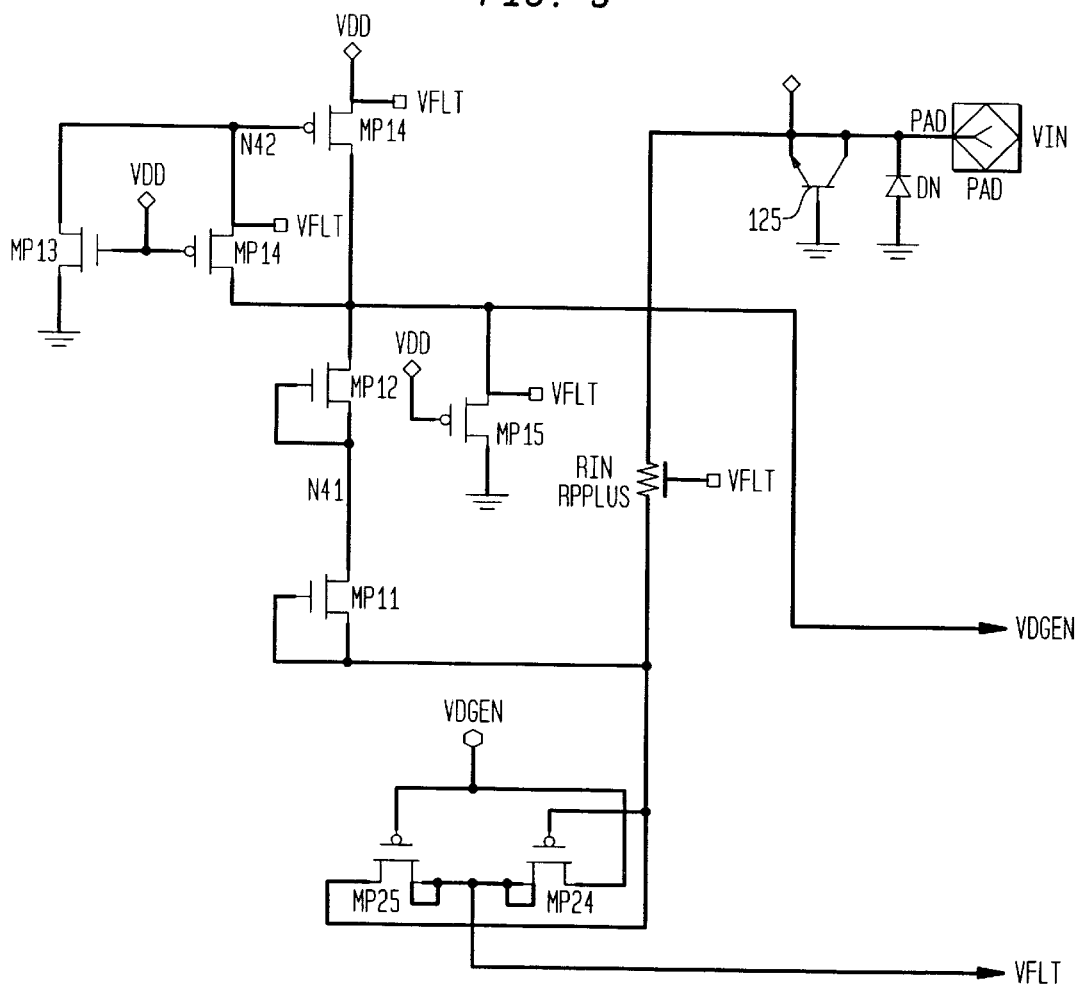
FIG. 9 illustrates a fail-safe voltage generation circuit.

In commonly-assigned copending application Ser. No. 09/318,158 entitled "A Fail Safe Buffer Capable of Operating with a Mixed Voltage Core", filed on May 25, 1999, a fail-safe voltage generation circuit, as shown in FIG. 9, is disclosed. When the fail-safe voltage generation circuit of FIG. 9 is in operation, if 3.3V VDD is applied to the circuit, VDGEN is equal to VDD. VFLT tracks the highest voltage between VDD and Vin. In other words, VFLT is a 3.3V VDD level if Vin is less than or equal to 3.3V VDD, and VFLT is at Vin level if Vin is a higher voltage than the 3.3V VDD. When the device is not in operation, such as when VDD is grounded and Vin is applied, VDGEN is (Vin−2Vth) and VFLT is Vin. When Vin is 3.3V, VDGEN is approximately 1.5V. When Vin is 5V, VDGEN is around 3.3V. This fail-safe voltage generation circuit, by itself, draws zero steady state dc current from the VDD power supply, and only sinks a negligible amount from Vin when VDD is grounded (i.e. the device is in a non-operation region).

Figure 10:
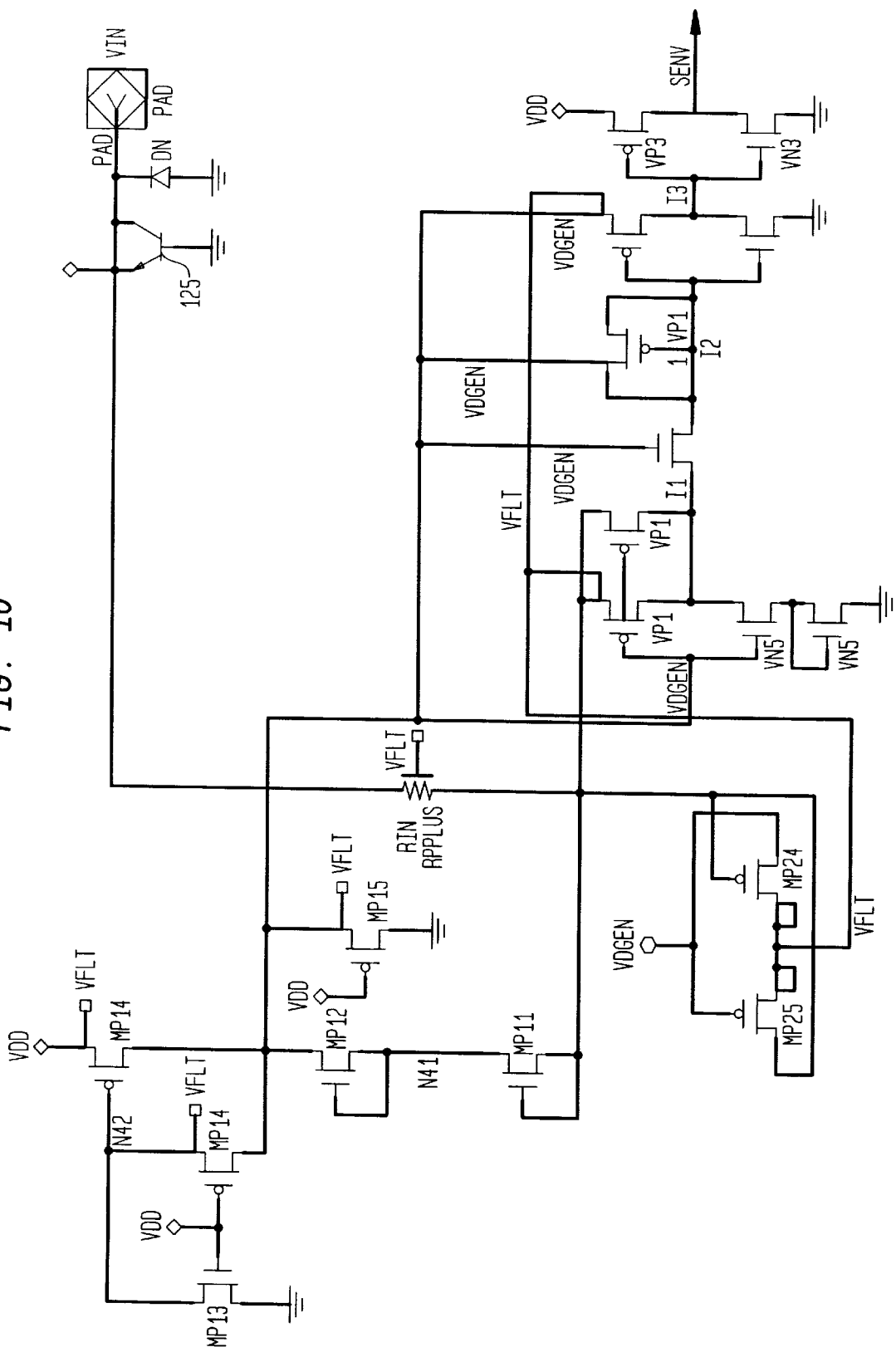
FIG. 10 illustrates the sense circuit of the present invention utilizing conjunction with the fail-safe voltage generation circuit of FIG. 9.

FIG. 10 illustrates the present invention used in conjunction with the fail-safe voltage generation circuit disclosed in the above-cited U.S. application Ser. No. 09/318,158. A power supply fail-safe low-voltage (3.3V) process sensing circuit can be constructed by using VDGEN as the fail-safe VDD voltage and VFLT as the PMOS substrate voltage on INV1 and INV2. This circuit is free of high voltage breakdown for all occasions. This creates a fully-static dual-voltage-level sense circuit having dual-voltage-range sensing; having a fully-static CMOS implementation to achieve low power operations; requiring no software assistance (e.g., to power down for power conservation) and being free of high voltage damage at the interface.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

We claim:

1. An integrated circuit having a dual-voltage sense circuit, said sense circuit comprising:
    a sense circuit input node supplied with an input voltage;
    a sense circuit power input node supplied with a power-supply voltage;
    a sense circuit output node outputting a digital signal of a voltage level equal to or less than the voltage level of a low-voltage digital signal, regardless of the voltage level of said input voltage;
    a sensing inverter comprising a plurality of transistors having gates connected in common to form a common-gate power supply input node, and having a voltage input connected to said sense circuit input node, said common-gate power-supply input node connected to said sense circuit power input node, and an output node; and
    a high-voltage-tolerant buffer having an input connected to the output node of said sensing inverter, and an output node connected to said sense circuit output node;
    wherein said sensing inverter receives said input voltage and outputs a first digital signal to the input of said high-voltage-tolerant buffer if said input voltage is within a first voltage range and outputs a second digital signal to the input of said high-voltage-tolerant buffer if said input voltage is within a second voltage range.

2. An integrated circuit as set forth in claim 1, wherein said sense circuit outputs a low-voltage digital one at said sense circuit output node when said sensing inverter outputs said first digital signal to said high-voltage tolerant buffer and outputs a digital zero at said sense circuit output node when said sensing inverter outputs said second digital signal to said high-voltage tolerant buffer.

3. An integrated circuit as set forth in claim 2, wherein said low-voltage digital one has a voltage level of nominally 3.3 volts.

4. An integrated circuit as set forth in claim 3, wherein said first voltage range is between about 4 volts and about 6 volts.

5. An integrated circuit as set forth in claim 4, wherein said second voltage range is from about 4 volt to zero volts.

6. An integrated circuit as set forth in claim 1, wherein said sensing inverter comprises:
    a first transistor having a gate coupled to said sense circuit power input node, a source connected to said sense circuit input node, and a drain;
    a second transistor having a gate coupled to said sense circuit power input node, a drain connected to said drain of said first transistor, and a source connected to a ground potential; and
    said output node connected to the drain-source connection of said first and second transistors.

7. An integrated circuit as set forth in claim 6, wherein said high-voltage-tolerant buffer comprises:
    an isolation pass transistor having a source connected to said input node of said high-voltage-tolerant buffer, a gate connected to said sense circuit power supply node; and a drain; and
    an inverter having an input node coupled to the drain of said isolation pass transistor and an output node coupled to the sense circuit output node;
    wherein said sense circuit outputs a low-voltage digital one at said sense circuit output node when said sensing inverter outputs said first digital signal to said high-voltage tolerant buffer and outputs a digital zero at said sense circuit output node when said sensing inverter outputs said second digital signal to said high-voltage tolerant buffer.

8. An integrated circuit as set forth in claim 1, further comprising a fail-safe voltage generation circuit supplying the input voltage and the power-supply voltage to said sense circuit so that the power-supply voltage never exceeds the power-supply voltage of a low-voltage process device.

9. An integrated circuit having a dual-voltage sense circuit, said sense circuit comprising:
    a sense circuit input node supplied with an input voltage;
    a sense circuit power input node supplied with a power-supply voltage;

a sense circuit output node outputting a digital signal of a voltage level equal to or less than the voltage level of a low-voltage digital signal, regardless of the voltage level of said input voltage; and a sensing inverter having a voltage input connected to said sense circuit input node, a power-supply input node connected to said sense circuit power input node, and an output node, said sensing inverter further comprising:

a first transistor having a gate coupled to said sense circuit power input node, a source coupled to said sense circuit input node, and a drain;

a second transistor connected in parallel with said first transistor, said second transistor having a gate coupled to said sense circuit power input node; a source coupled to said sense circuit input node; and a drain coupled to the drain of said first transistor;

a third transistor, having a gate coupled to said sense circuit power input node, a source coupled to the drains of said first and second transistors, and a drain; and a fourth transistor connected in series with said third transistor, said fourth transistor having a gate coupled to said sense circuit power input node, a source coupled to the drain of said third transistor, and a drain coupled to ground potential.

10. An integrated circuit having a dual-voltage sense circuit, said sense circuit comprising:

a sense circuit input node supplied with an input voltage;

a sense circuit power input node supplied with a power-supply voltage;

a sense circuit output node outputting a digital signal of a voltage level equal to or less than the voltage level of a low-voltage digital signal, regardless of the voltage level of said input voltage; and a sensing inverter, having a voltage input connected to said sense circuit input node, a power-supply input node connected to said sense circuit power input node, and an output node, said sensing inverter further comprising:

a first transistor having a gate coupled to said sense circuit power input node, a source coupled to said sense circuit input node, and a drain;

a second transistor connected in parallel with said first transistor, said second transistor having a gate coupled to said sense circuit power input node; a source coupled to said sense circuit input node; and a drain coupled to the drain of said first transistor;

a third transistor, having a gate coupled to said sense circuit power input node, a source coupled to the drains of said first and second transistors and a drain; and a fourth transistor configured as a diode and connected in series with said third transistor, said fourth transistor having a gate coupled to the drain of said third transistor, a source coupled to the drain of said third transistor, and a drain coupled to ground potential.

\* \* \* \* \*